(12) United States Patent
Miyadera

(10) Patent No.: US 7,229,733 B2
(45) Date of Patent: Jun. 12, 2007

(54) PRODUCTION PROCESS OF LIGHT EMITTING DEVICE

(75) Inventor: Toshiyuki Miyadera, Tsurugashima (JP)

(73) Assignee: Pioneer Corporation, Tokyo-to (JP)

( * ) Notice: Subject to any disclaimer, the term of this patent is extended or adjusted under 35 U.S.C. 154(b) by 92 days.

(21) Appl. No.: 10/799,606

(22) Filed: Mar. 15, 2004

(65) Prior Publication Data

US 2004/0174697 A1 Sep. 9, 2004

Related U.S. Application Data

(62) Division of application No. 09/798,999, filed on Mar. 6, 2001, now Pat. No. 6,740,538.

(30) Foreign Application Priority Data

Mar. 7, 2000 (JP) .............................. 2000-067184

(51) Int. Cl.
*G03G 13/06* (2006.01)

(52) U.S. Cl. ..................................... 430/102; 347/171

(58) Field of Classification Search .................. 430/30, 430/102, 106; 313/503, 504; 347/171
See application file for complete search history.

(56) References Cited

U.S. PATENT DOCUMENTS

| | | | |
|---|---|---|---|
| 3,885,961 A | 5/1975 | Kimura et al. | |
| 4,803,514 A * | 2/1989 | Hiratsuka et al. | ........... 399/178 |
| 4,827,290 A | 5/1989 | Yoritomo et al. | |
| 5,172,164 A | 12/1992 | Fujiwara et al. | |
| 5,347,344 A * | 9/1994 | Itoh | ........................ 346/76.1 |
| 6,344,661 B1 | 2/2002 | Nagase et al. | |

* cited by examiner

*Primary Examiner*—David Vu
(74) *Attorney, Agent, or Firm*—Young & Thompson

(57) ABSTRACT

A production process of a light emitting device capable of easily forming a fixed shape insulator layer irrespective of the quality of the material of a substrate is provided. The process of the present invention includes a process of forming an insulator layer by an electrophotography method, in the production process of a light emitting device equipped with a substrate, light emitting layers formed on the substrate, and an insulator layer mutually partitioning the light emitting layers.

16 Claims, 4 Drawing Sheets

PRODUCTION PROCESS OF LIGHT EMITTING DEVICE

CROSS REFERENCE TO RELATED APPICATIONS

This application is a division of Application No. 09/798,999, filed on Mar. 6, 2001, now U.S. Pat. No. 6,740,538, the entire contents of which are hereby incorporated by reference.

BACKGROUND OF THE INVENTION

1. Field of the Invention

The present invention relates to a production process of a light emitting device constituted such that light emitting layers formed on a substrate are mutually partitioned by an insulator layer.

2. Description of the Related Art

There has been known an electroluminescence panel having a structure in which light emitting layers containing a light emitting material are provided between stripe shape electrodes which were formed to mutually orthogonalized directions, and the light emitting layers are designed to be separated by an insulator layer by partitions constituting respective pixels. Fixed pixels selectively emit light by selectively impressing voltage between fixed electrodes which sandwich the light emitting layers, and an arbitrary picture image can be displayed.

FIGS. 6A to 6G show a portion of the production process of such electroluminescence panel. As shown in FIG. 6A, after a plural number of transparent electrodes 102 arranged in a stripe shape are formed on the surface of a glass plate 101, an insulator layer 103 is formed on the whole plane of the glass plate 101 as shown in FIG. 6B, and further, a resist 104 is coated on the insulator layer as shown in FIG. 6C. Then, the resist 104 is exposed through a photo-mask 105 as shown in FIG. 6D, and the resist 104 is developed as shown in FIG. 6E. Then, as shown in FIG. 6F, the insulator layer 103 is patterned by etching through the resist 104, and the resist 104 is peeled as shown in FIG. 6G.

According to the above-mentioned process, a fixed shape, for example, a lattice shape insulator layer 103 can be formed on the substrate. Further, after formation of the insulator layer 103, light emitting layers containing a light emitting material are formed on the region partitioned by the insulator layer 103, a plural number of electrodes are formed in a stripe shape to a direction (left and right directions of FIG. 6G) orthogonalized against transparent electrodes at the upper side of the light emitting layers in FIG. 6G.

Thus, when a glass plate is used, an insulator layer can be formed by a photolithography technology. However, when a resin substrate is used as a substrate, it is difficult to apply the above-mentioned photolithography technology at formation of the insulator layer because of problems such as heat resistance at baking a resist, solvent resistance at development of the resist and the like.

SUMMARY OF THE INVENTION

The object of the present invention is to provide the production process of a light emitting device capable of easily forming a fixed form insulator layer irrespective of the quality of the material of a substrate.

To solve the above problems, the production process of the light emitting device of the present invention is characterized in that the production process includes a process of forming the insulator layer by an electrophotography method, in a production process of a light emitting device equipped with a substrate, light emitting layers formed on the substrate, and an insulator layer mutually partitioning the light emitting layers.

According to the invention, since the insulator layer is formed by an electrophotography method, the insulator layer can be formed without using a photolithography technology in which heat resistance and solvent resistance are required for the substrate, and as the substrate, for example, a substrate made of a resin can be used. Further, the number of process can be reduced in comparison with the photolithography technology which includes process of coating, drying, exposure, development and the like of a resist.

The production process may include a process of forming the insulator layer on a transfer member by an electrophotography method, and a process of transferring the insulator layer which has been formed on the transfer member, to the substrate.

In this case, the insulator layer can be formed on various substrates by matching the property of the transfer member with the substrate. For example, when a member having elasticity is used as the transfer member, it becomes possible to correspond with a hard substrate composed of glass and the like.

The production process of the light emitting device of the present invention is characterized in that the production process includes a process of forming the insulator layer by a thermal transfer method, in the production process of a light emitting device equipped with a substrate, light emitting layers formed on the substrate, and an insulator layer mutually partitioning the light emitting layers.

According to the invention, since the insulator layer can be formed without using a photolithography technology in which heat resistance and solvent resistance are required for the substrate, a substrate made of a resin can be used as the substrate. Further, the number of process can be simplified in comparison with the photolithography technology which includes process of coating, drying, exposure, development and the like of a resist.

The production process may include a process of forming the insulator layer on a transfer member by a thermal transfer method, and a process of transferring the insulator layer which has been formed on the transfer member, to the substrate.

In this case, the insulator layer can be formed on various substrates by matching the property of the transfer member with the substrates. For example, when a member having elasticity is used as the transfer member, it becomes possible to correspond with a hard substrate composed of glass and the like.

The light emitting layers may contain at one or more of light emitting materials emitting light by impressing electric field.

The substrate may be constituted by a resin. According to the present invention, since the photolithography technology is not required to be used at formation of the insulator layer, heat resistance enough to endure the baking process of a resist and solvent resistance enough to endure a resist developing process are not required for the substrate, therefore the substrates made of a resin is not damaged.

DETAILED DESCRIPTION OF THE PREFERRED EMBODIMENT

The First Embodiment

The first embodiment in which the production process of the light emitting device of the present invention was applied to the production of an electroluminescence panel, is illustrated below referring to FIG. 1 to FIG. 5.

Figure 1:
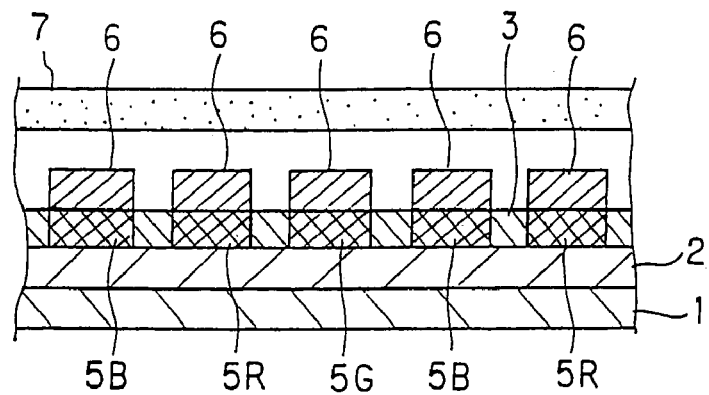
FIG. 1 is a sectional view of the electroluminescence panel produced by the production process of the present invention.
Figure 2A:
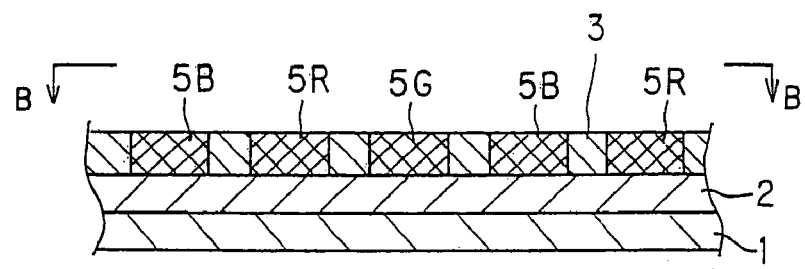
FIG. 2A is a sectional view showing the production courses of the electroluminescence panel.
Figure 2B:
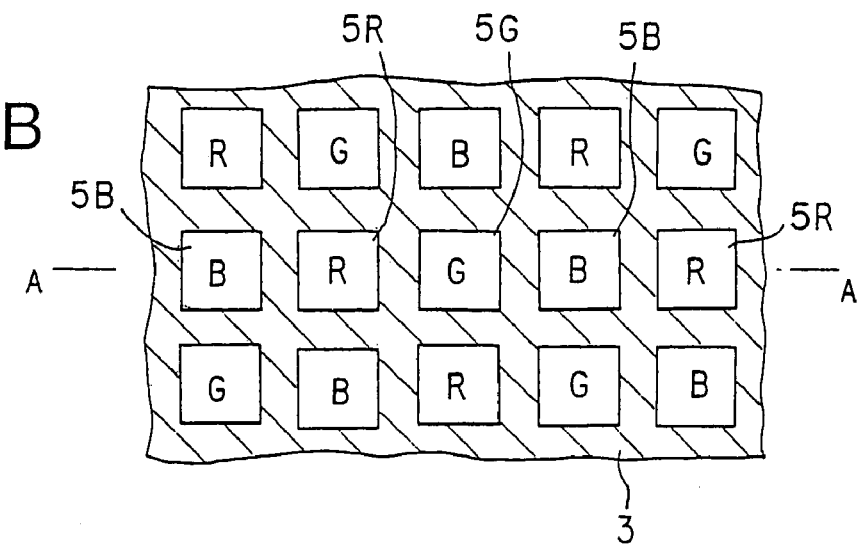
FIG. 2B is a plan view viewed from the B-B line direction of FIG. 2A.

FIG. 1 is a sectional view of the electroluminescence panel produced by the production process of the present invention, FIG. 2A is a sectional view showing the production courses of the electroluminescence panel of FIG. 1, and FIG. 2B is a plan view viewed from the B-B line direction of FIG. 2A.

As shown in FIG. 1 and FIG. 2, the electroluminescence panel 100 is equipped with a substrate 1 composed of a transparent polymer film, a plural number of positive electrodes 2 which were extended on the substrate 1 in a stripe shape to left and right directions of FIG. 1, an insulator layer 3 formed on the substrate 1 and the positive electrodes 2 in a lattice shape (refer to FIG. 2B), the light emitting layers 5R,5G,5B formed in a dot-matrix shape as surrounded by the insulator layer 3, a plural number of negative electrodes 6 which were formed in a stripe shape to a direction orthogonalized against the positive electrodes 2 at a position duplicated with the light emitting layers 5R, 5G, 5B, and a sealing glass 7 which seals the positive electrodes 2, the insulator layer 3, the hole transport layer not illustrated, the light emitting layers 5R,5G,5B and the negative electrodes 6, between the substrate 1 and the sealing grass 7. The positive electrodes 2 are composed of a transparent electro-conductive material such as ITO or the like, and the light emitting layer 5R emits red light, the light emitting layer 5G emits green light, and the light emitting layer 5B emits blue light, respectively, by impressing a fixed voltage between the positive electrodes 2 and the negative electrodes 6. The light emission of the light emitting layers 5R, 5G, 5B are confirmed by viewing from the substrate 1 side through the transparent positive electrodes 2 and the substrate 1.

Then, the production process of the electroluminescence panel 100 is illustrated.

Firstly, a transparent electro-conductive film such as an ITO film or the like is formed on one plane of the substrate 1 using a spattering method or the like, and then a plural number of positive electrodes 2 arranged in parallel at an fixed interval are formed by patterning the film.

Figure 3:
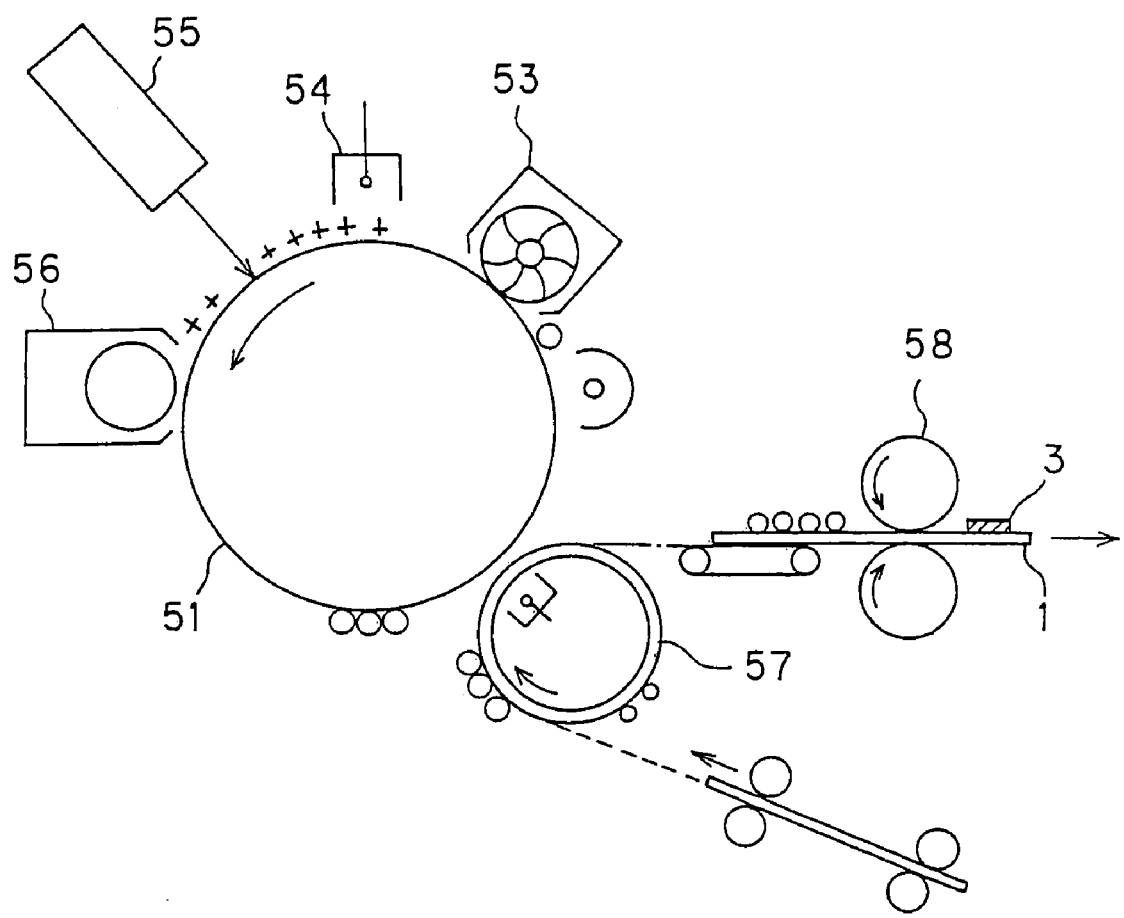
FIG. 3 is a drawing showing a device for forming the insulator layer by an electrophotography method.

Then, the insulator layer 3 is formed by an electrophotography method. FIG. 3 is a drawing schematically showing a device for forming the insulator layer 3. As shown in FIG. 3, the device 50 is equipped with a photo conductor drum 51 for transferring a toner, a neutralizer 53 removing electrification of the surface of the photo conductor drum 51, a corona electrifying device 54 electrifying the surface of the photo conductor drum 51 at positive electric potential by generating corona discharge, an exposure device 55 radiating laser beam to the photo conductor drum 51, a developer 56 making the toner stick to the surface of the photo conductor drum 51, a transfer drum 57 provided in confrontation with the photo conductor drum 51, a fixing device 58 fixing the toner by adding heat and pressure to the toner transferred.

As the toner for forming the insulator layer 3, for example, those obtained by pulverizing a mixture of various kind of resins, various kind of waxes, electrification controllers, carriers such as iron powder and the like, various kind of inorganic powders and the like, can be used. The toner is stored in the developer 56 of the device 50.

Specific example of the production process of the toner for forming the insulator layer is shown below.

Firstly, 75 parts by weight of a saturated polyester resin, 15 parts by weight of a styrene-acryl resin, 4 parts by weight of a polyethylene wax, and 2 parts by weight of an electrification controller are melted and kneaded to obtain a mixture. Then, the mixture is pulverized, and 0.5 part by weight of hydrophobic silica is mixed with 100 parts by weight of a powder composition obtained by classification and adjusted to be pulverized. Then, iron powder as a carrier is further mixed such that a powder concentration comes to be 9% by weight to prepare a toner.

Further, as the material of the insulator layer, various resins such as, for example, an acryl resin, a polyimide resin, a fluorinated polyimide resin, a PVA resin, a PC resin, a fluorine resin, a polyquinoline resin, a polyoxadiaryl resin, a polyolefin resin, a polyarylate resin, a polysulfone resin, a polysiloxane, a polyester resin, a PVC resin, a PVB resin, a PVF resin and the like can be used. Further, an inorganic powder may be added in a resin. As the inorganic material in this case, for example, $SiO_2$, $SiN$, $TaO$, $Al_2O_3$ and the like can be used.

As shown in FIG. 3, the substrate 1 on which the positive electrodes 2 are formed-is fed between the photo conductor drum 51 and the transfer drum 57.

After eliminating charge by the neutralizer 53, a lattice shape latent image corresponding to the shape of the insulator layer 3 is formed on the surface of the photo conductor drum 51 by scanning the surface of the photo conductor drum 51 which was electrified at positive electric potential by the corona electrifying device 54, with laser beam by the exposure device 55. Then, when the latent image formed on the surface of the photo conductor drum 51 is confronted with the developer 56, the toner is fed in like manner as the latent image and the lattice shape is developed on the surface of the photo conductor drum 51. Then, the toner on the photo conductor drum 51 is transferred on the substrate 1 at a position in confrontation with the transfer drum 57 while keeping the lattice shape, and then fixed on the substrate 1 by receiving heat and pressure caused by the fixing device 58. Thereby, the lattice shape insulator layer 3 is formed on the substrate 1.

Then, the light emitting layers 5R, 5G, 5B are formed in order by an electrophotography method. In order to form the light emitting layers 5R, 5G, 5B, the respective toners are made using corresponding colors of the light emitting materials.

Firstly, the toner of the light emitting layer 5R is stored in the developer 56 of the device 50. As shown in FIG. 3, the substrate 1 on which the positive electrodes 2 and the insulator layer 3 were formed is fed between the photo conductor drum 51 and the transfer drum 57.

After removing charge by the neutralizer 53, a dot shape latent image corresponding to the shape of the light emitting layer 5R is formed on the surface of the photo conductor drum 51 by scanning the surface of the photo conductor drum 51 which was electrified at positive electric potential by the corona electrifying device 54, with laser beam by the exposure device 55. Then, when the latent image formed on the surface of the photo conductor drum 51 is confronted with the developer 56, the toner is fed in like manner as the latent image and the dot shape corresponding to the shape of the light emitting layer 5R is developed on the surface of the photo conductor drum 51. Then, the toner on the photo conductor drum 51 is transferred on the substrate 1 at a position in confrontation with the transfer drum 57 while keeping the dot shape, and then fixed on the substrate 1 by receiving heat and pressure caused by the fixing device 58. Thereby, the dot shape light emitting layer 5R is formed on the substrate 1.

Further, using the toner for the light emitting layer 5G, the light emitting layer 5G is formed on the substrate 1 on which the light emitting layer 5R was formed, by the same process as in the light emitting layer 5R. Further, using the toner for the light emitting layer 5B, the light emitting layer 5B is formed on the substrate 1 on which the light emitting layer 5R and the light emitting layer 5G were formed, by the same process as in the light emitting layer 5R.

According to the above-mentioned processes, the light emitting layers 5R, 5G, 5B of three, colors are formed in accordance with a fixed arrangement.

Then, the negative electrodes 6 are formed by a vacuum evaporation method. The stripe shape negative electrodes 6 composed of aluminum are formed by vapor depositing aluminum by evaporation on the insulator layer 3 and the light emitting layers 5R, 5G, 5B through a shadow mask in which an opening of a shape corresponding to the negative electrodes 6 is formed.

In the present embodiment, since the insulator layer 3 is formed by an electrophotography method, heat resistance and solvent resistance are not required for the substrate 1 in like manner as a case of using a photolithography technology. Accordingly, the insulator layer 3 can be formed without damaging the substrate 1 composed of a polymer film. Further, the process can be simplified in comparison with a case of using the photolithography technology.

In the above-mentioned first embodiment, a case of forming the light emitting layers by an electrophotography method was illustrated, but as methods of forming the light emitting layers 5R, 5G, 5B, arbitrary methods such as a vacuum evaporation method, an ink jet method, a method by dispenser and the like can be used.

Further, the above-mentioned embodiment uses the substrate 1 composed of a polymer film, but the quality of the material of a substrate is not limited thereto. The insulator layer can be formed against a substrate of an inorganic material such as glass or the like, using an electrophotography method.

Further, an electron-injecting layer may be inserted between the light emitting layers and negative electrodes.

The Second Embodiment

The second embodiment in which the production process of the light emitting device of the present invention was applied to the electroluminescence panel is illustrated below referring to FIG. 4. The insulator layer is formed by a thermal transfer method in the second embodiment. The same process as in the first embodiment can be applied to the process other than formation of the insulator layer.

Figure 4:
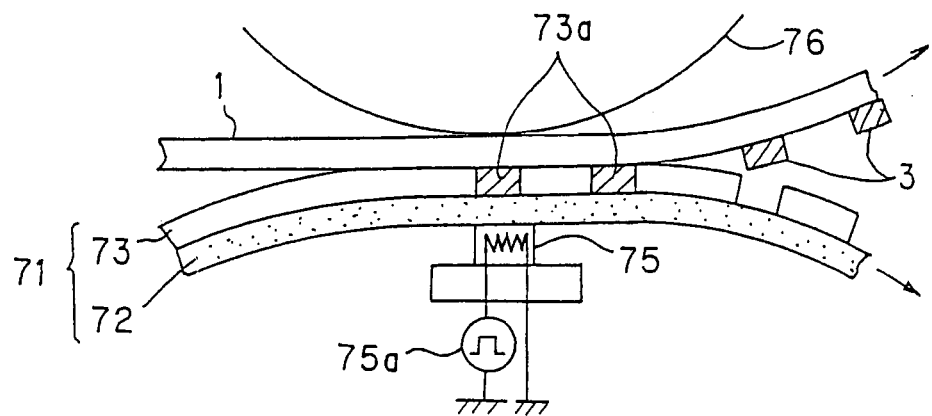
FIG. 4 is a drawing showing a method of forming the insulator layer by a thermal transfer method.

FIG. 4 is a drawing showing the production process of the insulator layer 3. As shown in FIG. 4, a ribbon 71 is composed of a base film 72 and a transfer layer 73 which is coated on the surface of the base film 72 and supports a insulator material. The substrate 1 in which the transparent electrodes 2 are formed and the ribbon 71 are conveyed between a thermal head 75 and a platen roll 76, pressure is added, heat from the thermal head 75 is added to the ribbon 71 at a fixed timing, therefore the transfer layer 73 is transferred on the substrate 1, and the insulator layer 3 is formed. The ribbon 71 can be prepared by coating and drying a toluene/MEK solution of a poly(butyl acrylate) on the surface of the base film 72 made of a poly(ethylene terephtharate).

The thermal head 75 is equipped with a plural number of heating members which are arranged to a direction orthogonalized to the conveying direction of the substrate 1, and controlled by signals 75 impressed from outside. A portion of the transfer layer 73 is selectively melted and transferred on the substrate 1 by impressing fixed signals to the respective heating members while conveying the substrate 1. Thereby, the insulator layer 3 can be patterned to a fixed shape. Further, in FIG. 4, the fixed region of the transfer layer 73 which is scheduled to be transferred and forms the insulation layer 3 is shown as a region 73a.

The heat release layers 5R, 5G, 5B are formed by the same process as in the insulator layer 3 using ribbons supporting the respective light emitting materials.

Specific example of the production process of the ribbon 71 is illustrated below.

SPECIFIC EXAMPLE 1

Of Production Process of Ribbon

A vinyl chloride-vinyl acetate resin 1000LK2 (manufactured by Denka Industry Ltd.) is dissolved in a mix solution of toluene:MEK=1:1, and a solution adjusted to have a concentration of about 5% by weight is prepared. The solution is coated on the surface of the base film 72 made of a poly(ethylene terephthlate) using a wire bar, and the ribbon 71 is prepared by drying this.

SPECIFIC EXAMPLE 2

Of Production Process of Ribbon

A polyester resin Vylon 200 (Toyobo Co., Ltd.) is dissolved in a mix solution of toluene:MEK=1:1, and a solution adjusted to have a concentration of about 5% by weight is prepared. The solution is coated on the surface of the base film 72 made of a poly(ethylene terephthlate) using a wire bar, and the ribbon 71 is prepared by drying this.

SPECIFIC EXAMPLE 3

Of Production Process of Ribbon

100 Parts by weight of a poly(butyl acrylate) is dissolved in a mix solution of toluene:MEK=1:1, and a solution adjusted to have a concentration of about 5% by weight is prepared. The solution is coated on the surface of the base film 72 made of a poly(ethylene terephthlate) using a wire bar, and the ribbon 71 is prepared by drying this.

Further, the constitution of the ribbon 71 is not limited to those shown in the above-mentioned production processes. For example, as the base film 72, resin films such as a polyester film, a polyimide film and the like in addition to a poly(ethylene terephthalate) film, papers such as a condenser paper, a galssine paper and the like can be used. Further, the insulator film material is not limited to the above-mentioned Examples, and thermally transferable other resins such as, for example, an acryl resin, a vinyl chloride resin, a vinyl acetate resin, a polyester resin, a polyethylene resin and the like may be used.

In the present embodiment, since the insulator layer 3 is formed by a thermal transfer method, heat resistance and solvent resistance are not required for the substrate 1 as a lithography technology is used. Accordingly, the insulator layer 3 can be formed without damaging the substrate 1 composed of a polymer film. Further, process can be simplified in comparison with a case of using the lithography technology.

The substrate 1 composed of a polymer film is used in the above-mentioned embodiment, but the quality of the material of the substrate is not limited to this. The insulator layer can be also formed using a thermal transfer method for the substrate of an inorganic material such as glass or the like.

The Third Embodiment

The third embodiment in which the production process of the light emitting device of the present invention was applied to the electroluminescence panel is illustrated below referring to FIG. 5.

Figure 5:
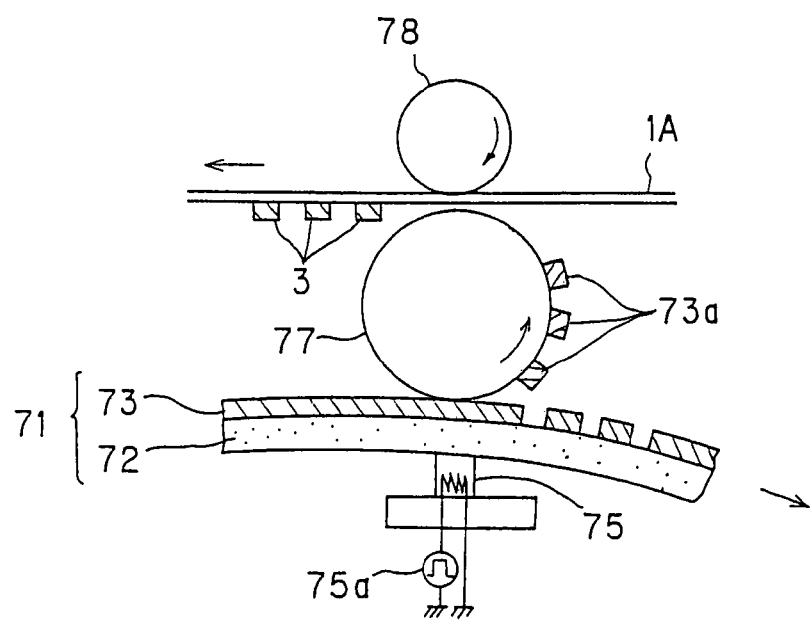
FIG. 5 is a drawing showing a method of forming the insulator layer by transfer through an intermediate transfer roll.
Figure 6A:
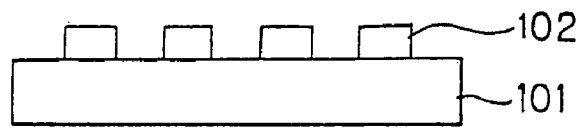
FIGS. 6A to 6G are drawings showing a portion of a conventional production process of an electroluminescence panel.
Figure 6B:
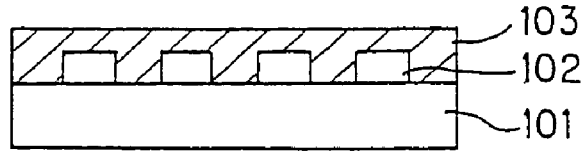
Figure 6C:
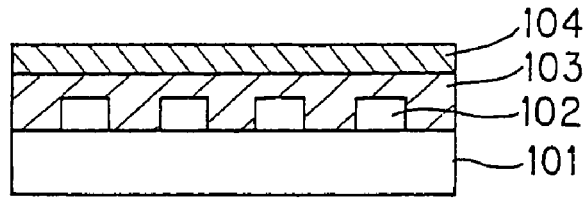
Figure 6D:
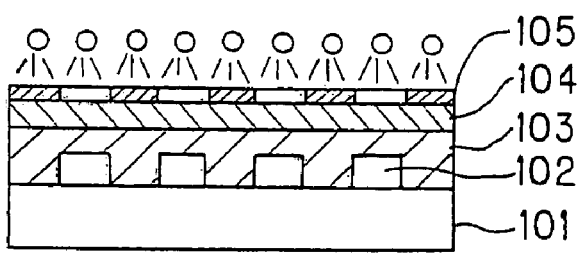
Figure 6E:
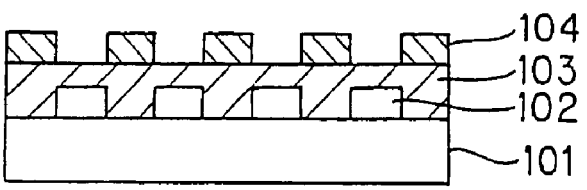
Figure 6F:
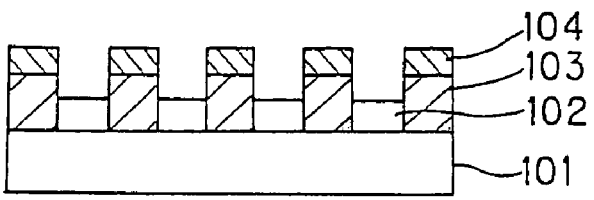
Figure 6G:
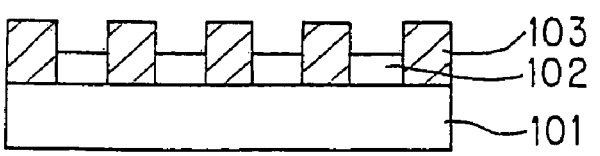

As shown in FIG. 5, in a third embodiment, the ribbon 71 and the thermal head 75 being similar to those in the second embodiment are used, but the transfer layer 73a of the ribbon 71 is not directly transferred on the substrate, and transferred on an intermediate transfer roll 77 having elasticity. The substrate 1A is conveyed while being sandwiched between the intermediate transfer roll 77 and the roll 78, and the transfer layer 73a transferred on the intermediate transfer roll 77 is transferred again on the substrate 1A.

Thus, in the third embodiment, since the transfer layer 73 supporting the insulator film material is transferred on the substrate 1A through the intermediate roll 77, the transfer layer 73 can be transferred even if the substrate 1A has not elasticity, in similar manner as a case in which the substrate 1A is a substrate made of glass, etc.

In the third embodiment, although the transfer layer is transferred on the intermediate transfer roll by a thermal transfer method, the transfer layer may be formed on the intermediate transfer roll in a fixed shape using the electrophotography in place of the thermal transfer method, and the transfer layer on the intermediate transfer roll may be transferred again on the substrate.

The entire disclosure of Japanese Patent Application No.2000-67184 filed on Mar. 7, 2000 including the specification, claims, drawing and summary is incorporated herein by reference in its entirety.

What is claimed is:

1. A production process of a light emitting device equipped with a substrate, light emitting layers formed on the substrate, and an insulator layer mutually partitioning the light emitting layers;

wherein the production process includes a process of forming the insulator layer by a thermal transfer method to produce the light emitting device equipped with the substrate, the light emitting layers formed on the substrate, and the formed insulator layer mutually partitioning the light emitting layers.

2. A production process of a light emitting device according to claim 1, which includes;

a process of forming the insulator layer on a transfer member by a thermal transfer method, and a process of transferring the insulator layer which has been formed on the transfer member, to the substrate.

3. A production process of a light emitting device according to claim 2;

wherein the light emitting layers contain a light emitting material emitting light by impressing electric field.

4. A production process of a light emitting device according to claim 3;

wherein the substrate is composed of a resin.

5. A production process of a light emitting device according to claim 2;

wherein the substrate is composed of a resin.

6. A production process of a light emitting device according to claim 1;

wherein the light emitting layers contain a light emitting material emitting light by impressing electric field.

7. A production process of a light emitting device according to claim 6;

wherein the substrate is composed of a resin.

8. A production process of a light emitting device according to claim 1;

wherein the substrate is composed of a resin.

9. A process for producing a light emitting device, comprising the step of:

using a thermal transfer method to form an insulator layer mutually partitioning light emitting layers of a light emitting device, wherein, the light emitting device is produced with a substrate, the light emitting layers formed on the substrate, and the formed insulator layer mutually partitioning the light emitting layers.

10. The process for producing a light emitting device of claim 9, comprising the further steps of:

forming a light emitting device substrate composed of a transparent film with a plural number of first electrodes extended on the substrate in a stripe shape to left and right directions; and forming a plural number of second electrodes in a stripe shape to a direction orthogonalized against the first electrodes at a position duplicated with the light emitting layers.

11. The process for producing a light emitting device of claim 9, comprising the further step of providing a light emitting device substrate, and wherein the thermal transfer method step comprises providing i) a ribbon composed of a base film and a transfer layer coated on a surface of the base film, ii) conveying the ribbon and the substrate between a thermal head and a platen roll so that selected portions of the transfer layer are transferred onto the substrate to form the insulator layer.

12. The process of claim 11, wherein, conveying the ribbon and the substrate between the thermal head and the platen roll, so that the transfer layer is transferred onto the substrate to form the insulator layer, includes an indirect transfer of the selected portions of the transfer layer onto the substrate, and the indirect transfer is by first transferring the selected portions of the transfer layer onto an elastic intermediate transfer roll and then from the transfer roll onto the substrate.

13. The process of claim 12, wherein,
the substrate is inelastic.

14. The process for producing a light emitting device of claim 9, wherein,
the thermal head is equipped with a plural number of heating members arranged to a direction orthogonalized to a conveying direction of the substrate, and
a portion of the transfer layer is selectively melted and transferred onto the substrate by impressing signals to the respective heating members while conveying the substrate.

15. The process of claim 9, wherein the substrate is composed of a polymer film.

16. The process of claim 9, wherein the substrate is composed of an inorganic material.

* * * * *